US012780740B2

(12) United States Patent
Ito et al.

(10) Patent No.: US 12,780,740 B2
(45) Date of Patent: Nov. 3, 2026

(54) PIEZOELECTRIC ELEMENT AND METHOD FOR MANUFACTURING SAME, AS WELL AS PIEZOELECTRIC VIBRATION DEVICE

(71) Applicant: TAIYO YUDEN CO., LTD., Tokyo (JP)

(72) Inventors: Ryo Ito, Takasaki (JP); Takayuki Goto, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 813 days.

(21) Appl. No.: 18/034,222

(22) PCT Filed: Sep. 29, 2021

(86) PCT No.: PCT/JP2021/035783
§ 371 (c)(1),
(2) Date: Apr. 27, 2023

(87) PCT Pub. No.: WO2022/097393
PCT Pub. Date: May 12, 2022

(65) Prior Publication Data
US 2023/0391675 A1 Dec. 7, 2023

(30) Foreign Application Priority Data
Nov. 4, 2020 (JP) ................................ 2020-184243

(51) Int. Cl.
*H10N 30/00* (2023.01)
*C04B 35/495* (2006.01)
(Continued)

(52) U.S. Cl.
CPC ............ *C04B 35/495* (2013.01); *C04B 35/64* (2013.01); *C04B 41/4564* (2013.01);
(Continued)

(58) Field of Classification Search
CPC ... C04B 35/495; C04B 35/64; C04B 41/4564; C04B 41/5116; C04B 41/88;
(Continued)

(56) References Cited

U.S. PATENT DOCUMENTS

2013/0320815 A1 12/2013 Hatano et al.
2017/0263845 A1* 9/2017 Hatano .................. H10N 30/50
2020/0295253 A1 9/2020 Watanabe et al.

FOREIGN PATENT DOCUMENTS

JP 2009010367 A 1/2009
JP 2013189325 A 9/2013
(Continued)

OTHER PUBLICATIONS

International Search Report (ISR) mailed Dec. 14, 2021, issued for International application No. PCT/JP2021/035783. (2 pages).

*Primary Examiner* — Julio C. Gonzalez
(74) *Attorney, Agent, or Firm* — Law Office of Katsuhiro Arai

(57) ABSTRACT

A piezoelectric element includes: a piezoelectric ceramic which has a perovskite compound expressed by the composition formula $Li_xNa_yK_{1-x-y}NbO_3$ (where $0.02<x\leq0.1$, $0.02<x+y\leq1$) as its primary component and which contains at least one of alkali earth metal selected from the group consisting of calcium, strontium, and barium, as well as silver, wherein the piezoelectric ceramic contains $LiNbO_3$ at the surface but contains no or less $LiNbO_3$ in the inner portion which is 5 μm or deeper from the surface, than at the surface; and at least one pair of electrodes formed on the surface of the piezoelectric ceramic.

9 Claims, 3 Drawing Sheets

(51) Int. Cl.

| | |
|---|---|
| ***C04B 35/64*** | (2006.01) |
| ***C04B 41/45*** | (2006.01) |
| ***C04B 41/51*** | (2006.01) |
| ***C04B 41/88*** | (2006.01) |
| ***H10N 30/045*** | (2023.01) |
| ***H10N 30/853*** | (2023.01) |

(52) U.S. Cl.
CPC .......... *C04B 41/5116* (2013.01); *C04B 41/88* (2013.01); *H10N 30/045* (2023.02); *H10N 30/8542* (2023.02); *C04B 2235/3255* (2013.01); *C04B 2235/3418* (2013.01); *C04B 2235/442* (2013.01); *C04B 2235/656* (2013.01); *C04B 2235/661* (2013.01)

(58) Field of Classification Search
CPC .... C04B 2235/3255; C04B 2235/3418; C04B 2235/442; C04B 2235/656; C04B 2235/661; C04B 37/028; C04B 41/0072; C04B 41/009; C04B 41/51; C04B 2235/3201; C04B 2235/3203; C04B 2235/3208; C04B 2235/3213; C04B 2235/3215; C04B 2235/3251; C04B 2235/3262; C04B 2235/3291; C04B 2235/75; C04B 2235/768; C04B 2237/365; C04B 2237/406; H10N 30/045; H10N 30/8542; H10N 30/097; C01G 33/006
See application file for complete search history.

(56) References Cited

FOREIGN PATENT DOCUMENTS

| | | | | | |
|---|---|---|---|---|---|
| JP | 2017163055 A | | 9/2017 | | |
| JP | 2020147466 A | | 9/2020 | | |
| KR | 20160026185 A | * | 3/2016 | ............ | H10N 30/03 |
| WO | 2012086449 A1 | | 6/2012 | | |

* cited by examiner

[Fig. 1]

PIEZOELECTRIC ELEMENT AND METHOD FOR MANUFACTURING SAME, AS WELL AS PIEZOELECTRIC VIBRATION DEVICE

CROSS-REFERENCE TO RELATED APPLICATIONS

This application is the U.S. National Phase under 35 U.S.C. § 371 of International Application PCT/JP2021/035783, filed Sep. 29, 2021, which claims priority to Japanese Patent Application No. JP2020-184243, filed Nov. 4, 2020. The International Application was published under PCT Article 21(2) in a language other than English.

TECHNICAL FIELD

The present invention relates to a piezoelectric element and a method for manufacturing the same, as well as a piezoelectric vibration device.

BACKGROUND ART

A piezoelectric element comprises a piezoelectric body having piezoelectricity, and at least one pair of electrodes connected thereto. Piezoelectric elements have properties to undergo mechanical displacements and consequently generate electrical charges, or to produce mechanical displacements based on potential differences between electrodes. Piezoelectric elements are widely used for sensors, actuators, etc., that utilize these properties.

For piezoelectric bodies that constitute piezoelectric elements, oftentimes piezoelectric ceramics, which are sintered bodies having piezoelectricity, are used. For the compositions of these piezoelectric ceramics, lead zirconate titanate ($Pb(Zr,Ti)O_3$, PZT) and solid solutions thereof are widely used. PZT-based piezoelectric ceramics have advantages in that their high Curie temperatures make them usable in a high-temperature environment. An added advantage is that their high electromechanical coupling coefficients permit efficient conversion of electrical energy and mechanical energy. Furthermore, these piezoelectric ceramics can be sintered at temperatures below 1000° C. when appropriate compositions are selected, which is another advantage because manufacturing costs of piezoelectric elements can be reduced. With regard to this point, significant cost reduction effects can be achieved, particularly with multilayer piezoelectric ceramics, because low-melting-point materials containing fewer quantities of expensive materials such as platinum and palladium can be used for the internal electrodes that are sintered simultaneously with the piezoelectric ceramic. However, PZT-based piezoelectric ceramics are considered problematic in that they contain lead, which is a harmful substance, and accordingly there is a need for alternative, lead-free piezoelectric ceramics.

To date, various lead-free piezoelectric ceramic compositions have been reported, such as those based on alkali niobates ($(Li,Na,K)NbO_3$), sodium bismuth titanate ($(Bi_{0.5}Na_{0.5})TiO_3$, BNT), bismuth layered compounds, and tungsten bronze, to name a few. Among these, alkali niobate-based piezoelectric ceramics are drawing attention as piezoelectric ceramics to replace PZT-based ones, owing to their high Curie temperatures and relatively high electromechanical coupling coefficients.

For example, Patent Literature 1 reports that high electrical resistance and piezoelectricity can be achieved with a piezoelectric element characterized in that it has first and second electrodes whose silver content is 50% by weight or more, and piezoelectric ceramic layers placed between the first and second electrodes and each layer constituted by a polycrystalline body of an alkali niobate-based piezoelectric ceramic containing at least one type of alkali earth metal selected from calcium, strontium, and barium, as well as silver.

BACKGROUND ART LITERATURE

Patent Literature

Patent Literature 1: Japanese Patent Laid-open No. 2017-163055

SUMMARY OF THE INVENTION

Problems to Be Solved by the Invention

In putting these piezoelectric elements using alkali niobate-based piezoelectric ceramics to practical use, growing emphasis is placed on improving their durability, in addition to improving their mechanical displacement performance and increasing the electrical charges generated. For example, it is preferable if, when piezoelectric elements and various equipment in which they are installed are placed in a high-temperature, high-humidity environment not anticipated under normal use conditions due to carelessness of the user, force majeure, etc., malfunctioning can be inhibited that would otherwise be caused by a dropout of the piezoelectric element from the substrate, dropout of members bonded to the piezoelectric element, separation of the electrodes from the piezoelectric element surface, etc.

Accordingly, an object of the present invention is to provide a piezoelectric element using alkali niobate-based piezoelectric ceramic that resists malfunctioning even when placed in a high-temperature, high-humidity environment.

Means for Solving the Problems

After conducting various studies to achieve the aforementioned object, the inventors of the present invention arrived at a hypothesis that the malfunctioning that occurs when a piezoelectric element is placed in a high-temperature, high-humidity environment is attributable to $Li_3NbO_4$ present at the surface of the alkali niobate-based piezoelectric ceramic or at the interface between it and the electrodes placed thereon. Then, on further studying ways to remove this $Li_3NbO_4$, the inventors found that, when a sintered compact obtained through sintering is placed in water whose temperature is higher than normal temperature and before electrodes are formed on its surface, $Li_3NbO_4$ can be removed easily and efficiently and also the bonding strength between the sintered compact and the substrate or electrodes will be retained even in a high-temperature, high-humidity environment, and eventually completed the present invention.

Specifically, the first aspect of the present invention to achieve the aforementioned object is a piezoelectric element comprising: a sintered compact formed by a piezoelectric ceramic which has a perovskite compound expressed by the composition formula $Li_xNa_yK_{1-x-y}NbO_3$ (where $0.02<x\leq 0.1$, $0.02<x+y\leq 1$) as its primary component and which contains at least one of alkali earth metal selected from the group consisting of calcium, strontium and barium, as well as silver, wherein the sintered compact contains $LiNbO_3$ at the surface but does not contain $LiNbO_3$ in the inner portion which is 5 μm or deeper from the surface; and at least one pair of electrodes formed on the surface of the sintered compact.

Additionally, the second aspect of the present invention is a method for manufacturing a piezoelectric element, including: preparing a sintered compact formed by a ceramic which has a perovskite compound expressed by the composition formula $Li_xNa_yK_{1-x-y}NbO_3$ (where $0.02<x\leq 0.1$, $0.02<x+y\leq 1$) as a primary component and which contains at least one of alkali earth metal selected from the group consisting of calcium, strontium and barium, as well as silver; placing the sintered compact in water whose temperature is higher than normal temperature; upon removal of the sintered compact from the water, forming at least one pair of electrodes on the surface of the sintered compact; and applying voltage between, and thereby polarizing, the at least one pair of electrodes.

Furthermore, the third aspect of the present invention is a piezoelectric vibration device including the aforementioned piezoelectric element and a vibration plate joined thereto.

Effects of the Invention

According to the present invention, a piezoelectric element using alkali niobate-based piezoelectric ceramic that resists malfunctioning even when placed in a high-temperature, high-humidity environment, can be provided.

MODE FOR CARRYING OUT THE INVENTION

Figure 1:
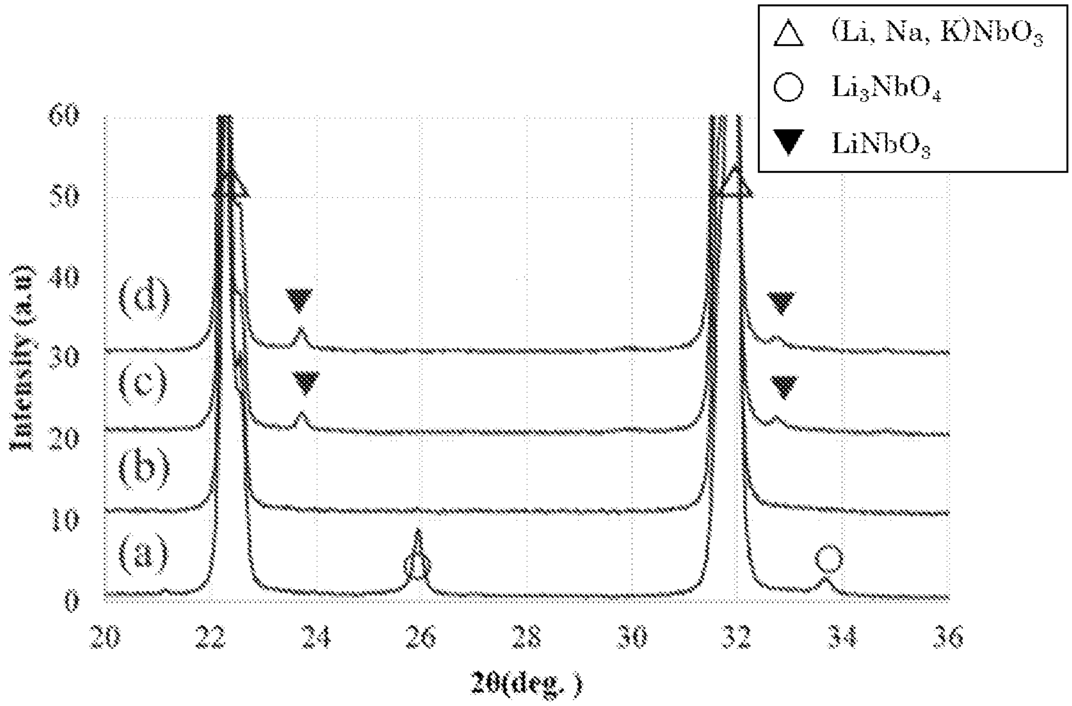
FIG. 1 A figure showing X-ray diffraction profiles, at a sintered compact surface, of the piezoelectric elements pertaining to the Examples and Comparative Examples FIG. 2 A schematic plane view of a piezoelectric element pertaining to an embodiment of the present invention FIG. 3 A diagram showing steps of the method for manufacturing a piezoelectric element pertaining to an embodiment of the present invention

The constitutions as well as operations and effects of the present invention are explained below, together with the technological concepts, by referring to the drawing. It should be noted, however, that the mechanisms of operations include estimations and whether they are right or wrong does not limit the present invention in any way. Also, of the components in the embodiments below, those components not described in the claims representing the most generic concepts are explained as optional components. It should be noted that a description of numerical range (description of two values connected by "to") is interpreted to include the described values as the lower limit and the upper limit.

In this Specification, "ceramic" refers to the non-electrode part in a "sintered compact" representing a compact comprising multiple particles bonded to each other. Accordingly, a "sintered compact" that does not include any electrode internally is described as conceptually synonymous with a "ceramic." Also, a "piezoelectric ceramic" refers to a type of the aforementioned "ceramic," that has been polarized to express piezoelectricity.

[Piezoelectric Element]

Figure 2:
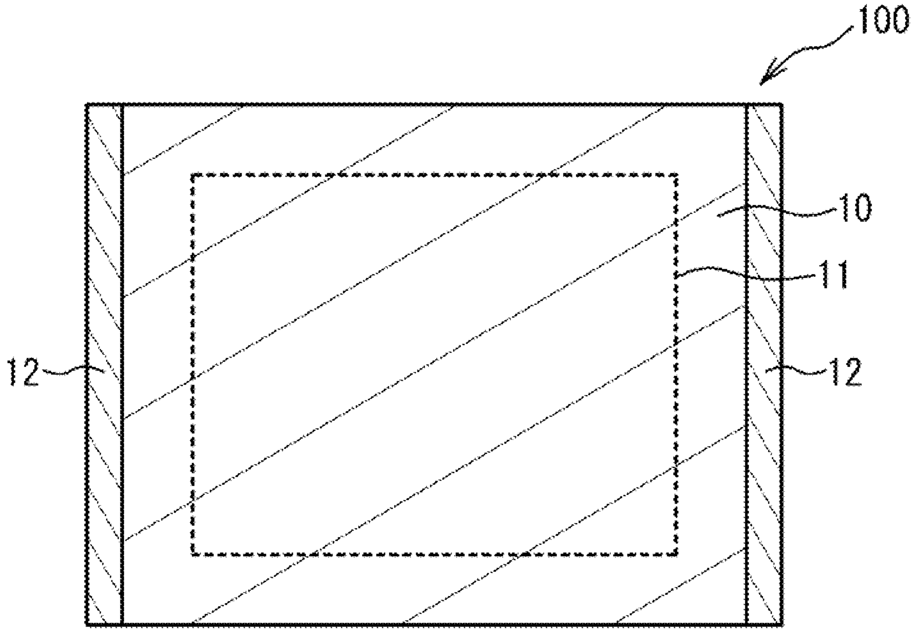

The piezoelectric element 100 pertaining to the first aspect of the present invention (hereinafter also referred to simply as "first aspect") comprises, as illustrated in FIG. 2, a sintered compact 10 formed by an alkali niobate-based piezoelectric ceramic, and at least one pair of electrodes 12 formed on its surface.

The piezoelectric ceramic that forms the sintered compact has a perovskite compound expressed by the composition formula $Li_xNa_yK_{1-x-y}NbO_3$ (where $0.02<x\leq 0.02<x+y\leq 1$) as its primary component. Setting the value of x in the aforementioned composition formula, or specifically the content ratio of Li, to over 0.02 makes the piezoelectric ceramic dense. In this sense, the value of x is adjusted to preferably 0.04 or greater, or more preferably 0.06 or greater. On the other hand, setting the value of x to or smaller inhibits excessive production of $Li_3NbO_4$ and other compounds that have conductivity, to make the piezoelectric ceramic one of excellent insulating property and durability. In this sense, the value of x is adjusted to preferably 0.09 or smaller, or more preferably 0.08 or smaller. Additionally, setting the value of x+y in the aforementioned composition formula, or specifically the total sum of the content ratio of Li and the content ratio of Na being an optional component, to over 0.02 but no greater than 1, makes the piezoelectric ceramic one of excellent piezoelectric properties.

Here, the following method is used to confirm that the piezoelectric ceramic has a perovskite compound expressed by the aforementioned composition formula as its primary component.

First, an X-ray diffraction system based on Cu-Kα rays (RINT2500 Series, manufactured by Rigaku Corporation) is used to measure the diffraction line profiles of the piezoelectric ceramic exposed at the surface of the piezoelectric element. Next, if a profile derived from the perovskite structure among the obtained X-ray diffraction profiles is recognized as the primary component, and also if the ratios of the strongest diffraction line intensities in the diffraction line profiles that are assumed to have been derived from other crystalline structures, to the strongest diffraction line intensity derived from the perovskite structure, are 10% or lower, then such piezoelectric ceramic is determined to have a perovskite compound as its primary component. It should be noted that, if an electrode is formed on the surface of the piezoelectric ceramic or the piezoelectric ceramic is coated and thus the piezoelectric ceramic is not exposed at the surface of the piezoelectric element, the electrode or coating is removed by means of polishing, etc., prior to measurement.

Next, to add conductivity, carbon is vapor-deposited on the piezoelectric ceramic that has been determined to have a perovskite compound as its primary component, after which energy-dispersive X-ray spectroscopic (EDS) measurement is performed using a silicon-drift energy-dispersive X-ray detector (Apollo, manufactured by AMETEK, Inc.) installed on a field-emission scanning electron microscope (FE-SEM) (S-4300, manufactured by Hitachi High-Technologies Corporation). The measurement voltage is set to 10 kV, and K—K, Na—K, and Nb—L spectra are used for quantitative evaluation. Measurement is performed over a sufficient period of time so that the K-K spectral line intensity reaches a count of 5000 or higher. Atomic-number correction, absorption correction, and fluorescence correction (ZAF corrections) are performed on the respective spectra, to calculate the content of each element.

Lastly, a composition formula is determined by using, as the values of y and 1−x−y in the aforementioned composition formula, the content ratios of Na and K to the calculated Nb content (in mol % or atomic %), respectively, and the piezoelectric ceramic, if its composition formula as determined herein falls within the ranges of the aforementioned composition formula, is considered to have a perovskite compound expressed by the aforementioned composition formula as its primary component.

The piezoelectric ceramic contains, in addition to the aforementioned primary component, at least one type of alkali earth metal selected from calcium, strontium, and barium. When the piezoelectric ceramic having a compound expressed by the aforementioned composition formula as its primary component contains at least one type of alkali earth metal as mentioned above, the piezoelectric ceramic becomes one of excellent piezoelectric properties as well as excellent insulation resistance as a result of production of a fine polycrystalline body. In this sense, the content of the alkali earth metal(s) is preferably 0.2 mol or higher, or more preferably 0.4 mol or higher, or yet more preferably 0.5 mol or higher, in total, relative to 100 mol of the aforementioned primary component. While the content of the alkali earth metal(s) is not limited in any way at the upper end, it is kept to preferably 5.0 mol or lower, or more preferably 4.0 mol or lower, or yet more preferably 3.0 mol or lower, in total, relative to 100 mol of the aforementioned primary component from the viewpoint of retaining high piezoelectric performance.

The piezoelectric ceramic contains silver in addition to the aforementioned primary component and alkali earth metal(s). This way, the sintered particles become finer and express excellent piezoelectric properties along with improved insulation resistance. This is due to the interaction between the aforementioned alkali earth metal(s) and silver. From the viewpoint of allowing this action to manifest fully, the content of silver is adjusted to preferably 0.5 mol or higher, or more preferably 0.7 mol or higher, or yet more preferably 1.0 mol or higher, relative to 100 mol of the aforementioned primary component. On the other hand, from the viewpoint of obtaining a piezoelectric element offering excellent durability, the content of silver is adjusted to preferably 5.0 mol or lower, or more preferably 4.0 mol or lower, or yet more preferably 3.0 mol or lower, relative to 100 mol of the aforementioned primary component.

The piezoelectric ceramic may further contain 0.1 mol or more but no more than 3.0 mol of Li, as well as 0.1 mol or more but no more than 3.0 mol of Si, relative to 100 mol of the aforementioned primary component. When both elements of Li and Si are contained, the piezoelectric ceramic can be made denser. Also, excess Li and Si not dissolving in the perovskite structure will react together to produce $Li_2SiO_3$, $Li_4SiO_4$, and other compounds offering high electrical insulating property, thereby inhibiting production of $Li_3NbO_4$ and other compounds that have conductivity, and contributing to inhibiting lowering and suppression of the electrical resistivity of the piezoelectric ceramic. From the viewpoint of enhancing this action, the ratio by mol of Si to Li (Si/Li) is adjusted to preferably 1.0 or higher, or more preferably 2.0 or higher.

The content of Li is adjusted to more preferably 0.3 mol or higher, or further, more preferably 0.5 mol or higher, relative to 100 mol of the primary component, from the viewpoint of allowing the aforementioned action to manifest fully. On the other hand, adjusting the content of Li relative to 100 mol of the primary component to 3.0 mol or lower inhibits production of $Li_3NbO_4$ and other compounds that have conductivity, thus making the piezoelectric ceramic one of excellent electrical insulating property and durability. In this sense, the content of Li is adjusted to more preferably 2.0 mol or lower, or further, more preferably 1.5 mol or lower, relative to 100 mol of the primary component.

It should be noted that, although Li is also a constituent element of the aforementioned primary component, the quantity of Li explained here does not include Li in this primary component. The quantity of Li contained in the piezoelectric ceramic but not constituting the primary component is calculated as the balance of the overall quantity of Li contained in the piezoelectric ceramic as measured using a laser ablation inductively coupled plasma mass spectrometer (LA-ICP-MS) or other system capable of quantifying Li, less the Li quantity that can be dissolved in the alkali niobate as calculated according to the method for determining the aforementioned alkali niobate composition formula.

The content of Si in the piezoelectric ceramic is adjusted to more preferably 0.5 mol or higher, or further, more preferably 1.0 mol or higher, relative to 100 mol of the primary component, from the viewpoint of allowing the aforementioned action to manifest fully. On the other hand, adjusting the content of Si relative to 100 mol of the primary component to 3.0 mol or lower reduces the production quantity of heterogeneous phases that have no piezoelectricity, thus making the piezoelectric ceramic one of excellent piezoelectric properties. In this sense, the content of Si is adjusted to more preferably 2.5 mol or lower, or further, more preferably 2.0 mol or lower, relative to 100 mol of the primary component.

Also, the piezoelectric ceramic may contain 0 to 2.0 mol of Mn relative to 100 mol of the aforementioned primary component. When the piezoelectric ceramic contains Mn, its electrical resistance improves. From the viewpoint of allowing this action to manifest fully, preferably the content of Mn is adjusted to 0.2 mol or higher. On the other hand, adjusting the Mn content to 2.0 mol or lower allows high piezoelectric performance to be retained. The aforementioned content of Mn is adjusted to preferably 1.5 mol or lower, or more preferably 1.0 mol or lower.

Here, the contents of the respective elements other than Li, relative to the primary component, are obtained by measuring the contents of Nb and the respective elements using a high-frequency inductively coupled plasma atomic emission spectrometer (ICP-AES) (iCAP6500, manufactured by Thermo Fisher Scientific Inc.), ion chromatography system (ICS-1600, manufactured by Thermo Fisher Scientific Inc.) or X-ray fluorescence (XRF) spectrometer (ZSX Primus-IV, manufactured by Rigaku Corporation), and then calculating the mol numbers of the respective elements relative to the content of Nb representing 100 mol, based on the content ratios of the respective elements to Nb.

The piezoelectric ceramic may also be one containing other additive elements or compounds within the ranges that allow the desired characteristics to be achieved, so long as its primary component is a perovskite compound expressed by the aforementioned composition formula. Examples of additive elements that can be contained include, in addition to Ta and Sb that are commonly used, Sc, Ti, V, Cr, Fe, Co, Ni, Cu, Zn, Y, Mo, La, Ce, Pr, Nd, Sm, Eu, Gd, Tb, Dy, Ho, Er, Tm, Yb, Lu, Hf, W, etc.

The sintered compact in the first aspect may be one having a layered structure constituted by the aforementioned piezoelectric ceramic and electrodes. In this case, the first aspect represents a so-called multilayer piezoelectric element where the electrodes that form the sintered compact are internal electrodes.

When the sintered compact includes internal electrodes, the electrode material with which to constitute the same is not limited in any way so long as it is a material having high conductivity while physically and chemically stable in the use environment of the multilayer piezoelectric element.

Examples of electrode materials that can be used include silver (Ag), copper (Cu), gold (Au), platinum (Pt), palladium (Pd), and nickel (Ni), as well as alloys thereof, etc. In particular, materials containing 50% by mass or more of silver are preferred in that they exhibit high conductivity. In the case of these materials, the content of silver in the electrode material is more preferably 70% by mass or higher, or yet more preferably 80% by mass or higher.

In the first aspect, the sintered compact has $LiNbO_3$ contained at its surface. This $LiNbO_3$ is derived from $Li_3NbO_4$ contained at the surface of the ceramic immediately after sintering. Since $Li_3NbO_4$ has relatively low stability as a compound, it breaks down in a high-temperature, high-humidity environment due to the action of moisture content. This means that, when the sintered compact is in a state where $Li_3NbO_4$ is present at its surface, placing in a high-temperature, high-humidity environment a piezoelectric element constituted by the sintered compact and electrodes formed thereon, may cause the bonding force between the sintered compact and the electrodes to drop and the electrodes may separate. Also, placing in a high-temperature, high-humidity environment a device in which a piezoelectric element comprising such sintered compact bonded to a substrate, vibration plate, or other member via an adhesive, may cause the bonding force between the sintered compact and the adhesive to drop and the piezoelectric element or other member may drop out. Such separation or dropout can cause the device to malfunction. However, such malfunctioning can be inhibited by using the below-mentioned process to break down or remove $Li_3NbO_4$ at the sintered compact surface and then producing highly stable $LiNbO_3$.

Also, producing $LiNbO_3$ after breaking down or removing $Li_3NbO_4$ contained at the surface of the sintered compact is preferred from the viewpoint of improving the insulating property of the piezoelectric element. Specifically, presence of highly conductive $Li_3NbO_4$ at the surface of the sintered compact allows electrical current to flow to $Li_3NbO_4$ from the electrode in contact therewith, to trigger surface conduction and increase the risks of short-circuiting and dielectric breakdown. Whereas, producing highly insulating $LiNbO_3$ can reduce these risks.

The following method is used to confirm that the sintered compact contains $LiNbO_3$ at its surface.

First, the piezoelectric ceramic part of the sintered compact exposed at the surface of the piezoelectric element is measured for diffraction line profiles using an X-ray diffraction system based on Cu-Kα rays (Ultima IV, manufactured by Rigaku Corporation). The X-ray generating conditions are 40 kV of accelerating voltage and 40 mA of electrical current. Also, measurement is performed by continuously scanning a 2θ range of 10 to 90° in the 2 θ/θ mode at a sampling width of 0.0200° , scan speed of 5.0°/min, divergence slit width of 1°, and divergence height-limiting slit width of 10 mm, with the scattering slit and receiving slit open, and without using the monochromator receiving slit. It should be noted that, if an electrode is formed on the surface of the piezoelectric ceramic or the piezoelectric ceramic is coated and thus the piezoelectric ceramic is not exposed at the surface of the piezoelectric element, the electrode or coating is removed by means of polishing, etc., prior to measurement.

Next, from the maximum value Imax and minimum value $I_{min}$ of diffraction intensity over the entire range (2θ=10 to 90°) of the obtained diffraction line profile, as well as from the maximum value $I_{1max}$ and minimum value $I_{1min}$ of diffraction intensity in a 2θ range of 23.4 to 24.0°, the standardized diffraction intensity $I_{LN}$ of $LiNbO_3$ is calculated using Formula 1 below. Then, when the obtained value of $I_{LN}$ is 1.2 or greater, it is determined that $LiNbO_3$ is contained at the surface of the sintered compact.

[Math. 1]

$$I_{LN} = \frac{I_{1\,max} - I_{1\,min}}{I_{max} - I_{min}} \times 100 \qquad \text{(Formula 1)}$$

The sintered compact 10, while containing $LiNbO_3$ at its surface, does not contain $LiNbO_3$ in the inner portion 11 which is 5 μm or deeper from the surface. This is because the aforementioned production of $LiNbO_3$ derived from $Li_3NbO_4$ occurs only near the surface of the sintered compact. In the sense that $LiNbO_3$ is not contained in the part away from the surface, the sintered compact in the first aspect is distinguished from those that contain $LiNbO_3$ uniformly in the piezoelectric ceramic.

The following method is used to confirm that $LiNbO_3$ is not contained in the inner portion which is 5 μm or deeper from the surface of the sintered compact.

First, the entire surface of the sintered compact constituting the piezoelectric element is polished to remove the surface by 5 μm. In areas where an electrode or coating is formed on the surface of the sintered compact, it is removed to expose the sintered compact, and then its surface is removed by 5 μm.

Next, the polished sintered compact is pulverized for use as a sample for X-ray diffraction measurement.

Next, the sample for X-ray diffraction measurement is measured for diffraction line profile under the same conditions employed by the aforementioned method for confirming that $LiNbO_3$ is contained at the sintered compact surface.

Lastly, $I_{LN}$ is calculated from the obtained diffraction line profile using Formula 1 mentioned above, and when the result is under 1.2, it is determined that $LiNbO_3$ is not contained in the inner portion which is 5 μm or deeper from the surface of the sintered compact.

In the first aspect, at least one pair of electrodes is formed on the surface of the sintered compact. The electrode material, shape, and placement are not limited in any way so long as the desired voltages can be applied to the piezoelectric ceramic or the desired voltages or electrical charges can be taken out from the piezoelectric ceramic. Examples of electrode materials include silver (Ag), copper (Cu), gold (Au), platinum (Pt), palladium (Pd), and nickel (Ni), as well as alloys thereof, etc. Also, examples of electrode shapes and placements include, for example, one where specific faces of the sintered compact are covered almost entirely, and one, when the sintered compact has a layered structure constituted by the piezoelectric ceramic and internal electrodes, where the exposed parts of the internal electrodes are covered and the internal electrode layers are connected alternately.

In the first aspect, preferably the electrodes placed on the surface of the sintered compact contain silver, because resistance heating will be inhibited during use due to the low electrical resistance of silver, while migration of silver will be inhibited in a high-temperature, high-humidity environment. A sintered compact containing $Li_3NbO_4$ at its surface may promote migration of silver because the components derived from $Li_3NbO_4$ that has broken down in a high-temperature, high-humidity environment form a migration path for silver at the sintered compact surface and also permeate between the sintered particles of the piezoelectric ceramic to form a migration path for silver between the particles. Whereas, with the sintered compact in the first aspect where surface $Li_3NbO_4$ has broken down or been removed and $LiNbO_3$ has been produced, the aforementioned migration path is not formed and therefore migration of silver is inhibited.

[Method for Manufacturing a Piezoelectric Element]

Figure 3:
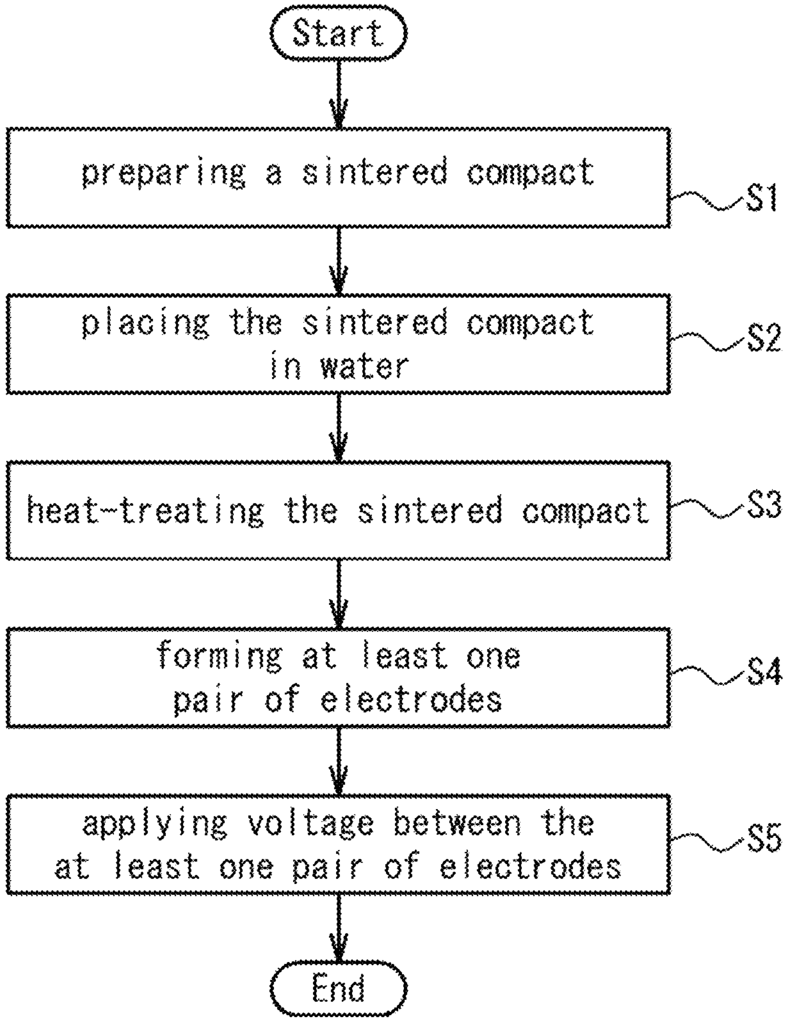

The method for manufacturing a piezoelectric element pertaining to the second aspect of the present invention (hereinafter also referred to simply as "second aspect") includes, as illustrated in FIG. 3: preparing a sintered compact formed by a ceramic which has a perovskite compound expressed by the composition formula $Li_xNa_yK_{1-x-y}NbO_3$ (where 0.02<x≤0.1, 0.02<x+y≤1) as a primary component and which contains at least one type of alkali earth metal selected from calcium, strontium, and barium, as well as silver (step S1); placing the sintered compact in water whose temperature is higher than normal temperature (step S2); upon removal of the sintered compact from the water, forming at least one pair of electrodes on the surface of the sintered compact (step S4); and applying voltage between, and thereby polarizing, the at least one pair of electrodes (step S5).

The method for obtaining a sintered compact is not limited in any way, but in terms of cost, preferably a method of mixing powdered materials and heat-treating the mixture so that a perovskite compound would be produced, and then forming and sintering the perovskite compound, is adopted. An example of manufacturing method is explained below.

First, the prescribed quantities of lithium compound powder, sodium compound powder, potassium compound powder, and niobium compound powder are mixed and calcined to obtain a calcined powder whose primary component is a perovskite compound expressed by the composition formula $Li_xNa_yK_{1-x-y}NbO_3$ (where 0.02<x≤0.1, 0.02<x+y≤1).

The lithium compound, sodium compound, potassium compound, and niobium compound to be used as materials are not limited in composition, purity, particle size, etc., so long as they are powders that will react with one another when calcined and produce a perovskite compound expressed by the composition formula $Li_xNa_yK_{1-x-y}NbO_3$ (where 0.02<x≤0.1, 0.02<x+y≤1). They may be compounds that contain two or more types of elements among Li, Na, K, and Nb, or compounds that contain other elements acting as additive elements. Examples of lithium compounds that can be used include lithium carbonate ($Li_2CO_3$), etc. Also, examples of sodium compounds that can be used include sodium carbonate ($Na_2CO_3$), sodium hydrogen carbonate ($NaHCO_3$), etc. Also, examples of potassium compounds that can be used include potassium carbonate ($K_2CO_3$), potassium hydrogen carbonate ($KHCO_3$), etc. Also, examples of niobium compounds that can be used include niobium pentoxide ($Nb_2O_5$), etc.

The method for mixing the material powders is not limited in any way so long as the respective powders are mixed uniformly while mixing-in of impurities is prevented, and either dry mixing or wet mixing may be adopted. If wet mixing using a ball mill is adopted as the mixing method, the mixing should be performed for approx. 8 to 24 hours, for example.

The calcining conditions are not limited so long as the respective materials will react with one another and a calcined powder will be obtained whose primary component is a perovskite compound expressed by the aforementioned composition formula, and, for example, the conditions may be 2 to 8 hours at 700 to 1000° C. in air atmosphere, for example. If the sintering temperature is too low or the sintering period is too short, there are concerns that unreacted materials or intermediate products may remain. If the sintering temperature is too high or the sintering period is too long, on the other hand, there are concerns that the alkali components will volatilize and a compound of the desired composition may not be obtained, or generated substances will agglomerate and become harder to be crushed, thus causing the productivity to drop.

Next, the calcined powder obtained through calcination is mixed with a compound containing at least one type of alkali earth metal element selected from the group that consists of Ca, Sr, and Ba, and also with silver or other compound containing silver, to obtain a forming powder. As this is being done, a compound containing various additive elements such as Li, Si, and Mn may be mixed in at the same time.

The alkali earth metal-containing compound and silver or other silver-containing compound to be mixed into the calcined powder, as well as the compound containing various additive elements to be mixed into the calcined powder as necessary, are not limited in composition, purity, particle size, etc., so long as they can form a ceramic of the desired composition in the sintered compact to be ultimately obtained. Regarding their compositions, two or more types of additive elements may be contained. Examples of alkali earth metal element-containing compounds that can be used include calcium carbonate ($CaCO_3$), calcium metasilicate ($CaSiO_3$), calcium orthosilicate ($Ca_2SiO_4$), etc., in the case of calcium compounds, strontium carbonate ($SrCO_3$), etc., in the case of strontium compounds, and barium carbonate ($BaCO_3$), etc., in the case of barium compounds, respectively. Also, examples of silver-containing compounds that can be used include silver oxide ($Ag_2O$), etc. Also, examples of lithium compounds that can be used include lithium carbonate ($Li_2CO_3$), lithium metasilicate ($Li_2SiO_3$), lithium orthosilicate ($Li_4SiO_4$), etc. Also, examples of silicon compounds that can be used include silicon dioxide ($SiO_2$), lithium metasilicate ($Li_2SiO_3$), lithium orthosilicate ($Li_4SiO_4$), calcium metasilicate ($CaSiO_3$), calcium orthosilicate ($Ca_2SiO_4$), etc. Furthermore, examples of manganese compounds that can be used include manganese carbonate ($MnCO_3$), manganese monoxide (MnO), manganese dioxide ($MnO_2$), trimanganese tetraoxide ($Mn_3O_4$), manganese acetate ($Mn(OCOCH_3)_2$), etc.

The method for mixing these compounds with the calcined powder is not limited in any way so long as the respective powders are mixed uniformly while mixing-in of impurities is prevented, and either dry mixing or wet mixing may be adopted. Also, the mixing can double as a process to disintegrate the calcined powder. If wet mixing using a ball mill is adopted as the mixing method, the mixing should be performed for approx. 8 to 24 hours, for example.

Next, the forming powder obtained through mixing is formed into the desired shape. For the forming method, the uniaxial pressing method, casting method, extrusion method, doctor blade method or any other method commonly used for forming of ceramics may be adopted. Depending on the forming method, the forming powder may be mixed with a binder, plasticizer, dispersant, etc., into a forming composition beforehand.

When the sintered compact includes internal electrodes, that is, when it has a layered structure constituted by a ceramic and electrodes, a method of mixing the forming powder with a binder, etc., to form a slurry or green body and then forming it into sheet shapes as green sheets, after which internal electrode patterns are formed on the green sheets and the prescribed number of green sheets are stacked in the prescribed order and bonded together, should be adopted as the forming method. At this time, the internal electrode patterns are shaped in such a way that they can be connected alternately in the stacking direction. The internal electrode patterns should be formed in any commonly used method, where a method of printing or applying a paste containing an electrode material is preferred in terms of cost. If internal patterns are formed by means of printing or application, glass frit or other powder having the same composition as the forming powder (co-material) may be contained in the paste to improve its adherence strength on the ceramic after sintering.

Lastly, the compact is sintered to obtain a sintered compact. If the compact contains organic components such as binder, plasticizer, dispersant, etc., these organic components are removed prior to sintering. When this is done, the removal and sintering of organic components may be performed in succession using the same sintering system. Examples of sintering conditions include 850 to 1100° C. for 1 to 5 hours in the atmosphere.

In the second aspect, the prepared sintered compact is placed in water whose temperature is higher than normal temperature. Here, "normal temperature" refers to a temperature achieved without any cooling or heating in particular, and represents any temperature in a range of roughly 5 to 35° C. Also, "placed in water" means that the entire surface of the sintered compact contacts water. Examples of modes of placement in water whose temperature is higher than normal temperature includes, for example, soaking in warm water, and placement in a heated atmosphere containing moisture exceeding the saturated water vapor level. Placing the sintered compact in water whose temperature is higher than normal temperature breaks down or removes the $Li_3NbO_4$ produced at the surface of the sintered compact during sintering. From the viewpoint of promoting the breakdown or removal of $Li_3NbO_4$, the temperature of the water in which the sintered compact is placed (which contacts the sintered compact) is adjusted to preferably 60° C. or higher, or more preferably 70° C. or higher, or yet more preferably 80° C. or higher. Also, the soaking or placement period is adjusted preferably to 20 minutes or longer, or more preferably 30 minutes or longer, or yet more preferably 1 hour or longer. The higher the water temperature, the shorter the time needed to break down or remove $Li_3NbO_4$ becomes, and therefore, from the viewpoint of improving productivity, preferably high-temperature water is utilized to shorten the placement period.

The sintered compact that has been placed in water and removed from the water as described above may be heat-treated at 300 to 900° C. in air prior to the forming of electrodes mentioned below (step S3). This way, any Li compound and Nb compound that may remain at the sintered compact surface after the breakdown of $Li_3NbO_4$ will react with each other to produce $LiNbO_3$ having high chemical stability and electrical insulating property. This significantly limits property change at the sintered compact surface in a high-temperature, high-humidity environment and inhibits malfunctioning. Also, risks of short-circuiting and dielectric breakdown can be reduced due to the high electrical insulating property of $LiNbO_3$.

Next, electrodes are formed on the surface of the sintered compact. Methods for forming electrodes include a method of printing or applying an electrode paste and then baking the paste, a method of vapor-depositing an electrode material, and the like. If electrodes are formed by baking, the heating of the sintered compact may produce $LiNbO_3$ at the sintered compact surface according to the mechanism described above. For the electrode material, those explained in the first aspect can be used.

Lastly, the electrodes are polarized by applying voltage between them. This aligns the orientations of spontaneous polarizations in the ceramic and allows piezoelectricity to manifest. The polarization conditions are not limited in any way so long as the orientations of spontaneous polarizations in the ceramic can be aligned without causing cracks or other damage to the sintered compact. As an example, an electric field of 4 to 6 kV/mm may be applied at a temperature of 100 to 150° C.

[Piezoelectric Vibration Device]

The piezoelectric element pertaining to the first aspect is used favorably in a piezoelectric vibration device. Accordingly, a vibration device using the piezoelectric element is explained as a third aspect of the present invention.

The vibration device pertaining to the third aspect of the present invention operates by applying electrical signals to and thereby vibrating the piezoelectric element, and causing a vibration plate to vibrate as a result.

The material for the vibration plate to be used is not limited in any way so long as it will vibrate as a result of the piezoelectric element vibrating, and, for example, polycarbonate, acrylic or other resin, SUS, brass or other metal, or glass, and the like may be used. Also, the dimensions and shape of the vibration plate are not limited in any way, either, and, for example, a rectangular plate, polygonal plate, circular plate, or oval plate, and the like of 10 to 500 μm in thickness may be utilized.

The means for joining the piezoelectric element to the vibration plate is not limited in any way so long as the vibration of the piezoelectric element can be transmitted efficiently to the vibration plate, and an adhesive using an epoxy-based resin, etc., or double-sided tape may be utilized, for example.

EXAMPLES

The present invention is explained more specifically below using examples; it should be noted, however, that the present invention is not limited to these examples.

Comparative Example 1

[Manufacturing of Calcined Powder]

As starting materials, high-purity lithium carbonate ($Li_2CO_3$), sodium carbonate ($Na_2CO_3$), potassium carbonate ($K_2CO_3$), and niobium pentoxide ($Nb_2O_5$) were used.

These starting materials were weighed so that the calcined powder to be obtained would have a composition formula of $Li_{0.06}Na_{0.52}K_{0.42}NbO_3$, and then wet-mixed in a ball mill.

The mixed slurry was dried, and the resulting mixed powder was calcined under the conditions of 3 hours at 900° C. in air, to obtain a calcined powder.

[Manufacturing of Compact]

To the obtained calcined powder, high-purity lithium carbonate ($Li_2CO_3$), strontium carbonate ($SrCO_3$), manganese carbonate ($MnCO_3$), and silicon dioxide ($SiO_2$) were added by quantities that would give 1.3 mol of Li, 0.5 mol of Sr, 0.5 mol of Mn, and 1.3 mol of Si, relative to 100 mol of $Li_{0.06}Na_{0.52}K_{0.42}NbO_3$, to obtain a forming powder.

A polyvinyl butyral-based binder was mixed into the obtained forming powder, to obtain a forming composition.

Using the doctor blade method, the obtained forming composition was formed into green sheets of 80 μm in thickness. A conductor paste containing Ag and Pd at a ratio by mass of Ag/Pd=7/3 was screen-printed on these green sheets according to desired patterns. After the conductor paste was dried, 30 of the green sheets were stacked and pressure-bonded together under heating with a pressure of approximately 50 MPa, to obtain a compact.

[Manufacturing of Sintered Compacts]

The obtained compact was cut into individual pieces that were put through a binder removal process in air and then sintered for 3 hours at 1100° C. in air, to obtain sintered compacts. [Manufacturing of Piezoelectric Element]

On the opposing side faces of the obtained sintered compact (faces parallel with the direction in which the green sheets are stacked), an Ag paste was applied in a manner covering the end parts of the internal electrodes exposed on the respective side faces, after which the sintered compact was passed through a belt furnace set to 800° C. to bake the paste, to form one pair of electrodes. The sintered compact on which the electrodes had been formed was placed in a 100° C. thermostatic chamber and an electric field of 3 kV/mm was applied for 15 minutes between, and therefore to polarize, the electrodes, to obtain the piezoelectric element pertaining to Comparative Example 1.

[Confirmation of Presence/Absence of $LiNbO_3$ at Surface of Sintered Compact]

When the aforementioned method was used to confirm whether or not $LiNbO_3$ was contained at the surface of the sintered compact with regard to the obtained piezoelectric element, $I_{LN}$ was 0.47 and it was determined that $LiNbO_3$ was not contained. The X-ray diffraction measurement result (diffraction line profile) concerning the sintered compact surface of the piezoelectric element pertaining to Comparative Example 1 is shown as (a) in FIG. 1. Peaks due to $Li_3NbO_4$ were confirmed in the diffraction line profile.

[Manufacturing of Piezoelectric Vibration Device and Measurement of Adherence Strength of Vibration Plate]

On the top face of the piezoelectric element pertaining to Comparative Example 1, or specifically on one of the faces perpendicular to the direction in which the green sheets are stacked, a SUS plate (made with SUS304) of 500 μm in thickness was bonded as a vibration plate using an epoxy-based adhesive, to obtain the piezoelectric vibration device pertaining to Comparative Example 1.

A tensile test was conducted on the obtained piezoelectric vibration device by applying a tensile load between the vibration plate and the piezoelectric element in the direction perpendicular to the bonded surface of the vibration plate using a load-displacement measuring unit (FSA Series, manufactured by Imada Co., Ltd.), wherein the maximum stress that must be generated to separate the vibration plate from the piezoelectric element was defined as vibration plate adherence strength. The obtained vibration plate adherence strength was 18 $N/cm^2$. Also, when a piezoelectric vibration device manufactured according to the same method was placed for 24 hours in a thermo-hygrostat set to 40° C. and 90% relative humidity, and then tensile-tested according to the same method, vibration plate adherence strength dropped substantially to 0.7 $N/cm^2$.

[Confirmation of Stability of $Li_3NbO_4$ Contained at Sintered Compact Surface]

To confirm that the aforementioned drop in vibration plate adherence strength is attributable to a breakdown of $Li_3NbO_4$ contained at the sintered compact surface, and that this $Li_3NbO_4$ can be broken down or removed by placing the sintered compact in water whose temperature is higher than normal temperature, X-ray diffraction measurement was performed, according to the same method employed for confirming presence/absence of $LiNbO_3$, on a measurement sample obtained by soaking for 30 minutes in 80° C. warm water a sintered compact obtained through the steps up to sintering. The obtained diffraction line profile is shown as (b) in FIG. 1. In the diffraction line profile, loss of the peaks due to $Li_3NbO_4$ as observed on the piezoelectric element before soaking in warm water (refer to (a) in the same figure) was confirmed. Based on this result, it is clear that $Li_3NbO_4$ contained at the sintered compact surface is low in chemical stability and thus breaks down due to the action of water in a high-temperature, high-humidity environment, causing vibration plate adherence strength to drop. Also, it can be argued that, by placing the sintered compact in water whose temperature is higher than normal temperature, $Li_3NbO_4$ contained at the sintered compact surface breaks down or is removed and a drop in vibration plate adherence strength will be inhibited.

[Evaluation of Ag Migration from Electrode]

On the piezoelectric vibration device that had been placed for 24 hours in a thermo-hygrostat set to 40° C. and 90% relative humidity, AC unipolar driving test was performed under the conditions of 3 kV/mm, 50 Hz, and 2 million cycles in the same thermo-hygrostat. The piezoelectric ceramic part exposed on the surface of the piezoelectric vibration device completing the test was area-analyzed, near the electrode that served as the positive electrode during the driving test, using a SEM-EDS (FE-SEM (S-4300) manufactured by Hitachi High-Technologies Corporation, installed with a silicon-drift energy-dispersive X-ray detector (Apollo) manufactured by AMETEK, Inc.), and the degree of Ag migration from the electrode was evaluated based on the mapped image showing the distribution of Ag. Since the region of high Ag concentration in the mapped image extended to positions where the distance from the electrode exceeded 400 μm, it can be argued that the piezoelectric vibration device pertaining to Comparative Example 1 will, if placed in a high-temperature, high-humidity environment, experience active migration of Ag during driving.

Example 1

[Manufacturing of Piezoelectric Element and Confirmation of Presence/Absence of $LiNbO_3$]

A sintered compact manufactured according to the same method in Comparative Example 1 was soaked for 30 minutes in 80° C. warm water and then heat-treated for 30 minutes at 600° C. in air, and on the obtained sintered compact, electrodes were formed and polarized according to the same procedure in Comparative Example 1, to obtain the piezoelectric element pertaining to Example 1. When the same method in Comparative Example 1 was used to confirm whether or not $LiNbO_3$ was contained at the surface of the sintered compact with regard to the obtained piezoelectric element, $I_{LN}$ was 2.1, and it was determined that $LiNbO_3$ was contained. Also, when the aforementioned method was used to confirm whether or not $LiNbO_3$ was contained in the inner portion which is 5 μm or deeper from the surface, $I_{LN}$ was 0.73, and it was determined that $LiNbO_3$ was not contained. The X-ray diffraction measurement result (diffraction line profile) concerning the sintered compact surface of the piezoelectric element pertaining to Example 1 is shown as (c) in FIG. 1. In the diffraction line profile, loss of peaks due to $Li_3NbO_4$ as observed on the piezoelectric element pertaining to Comparative Example 1 (refer to (a) in the same figure), and emergence of peaks due to $LiNbO_3$, were confirmed.

[Manufacturing of Piezoelectric Vibration Device and Measurement of Vibration Plate Adherence Strength]

A vibration plate was bonded to the piezoelectric element pertaining to Example 1 according to the same method in Comparative Example 1, to obtain the piezoelectric vibration device pertaining to Example 1. When the obtained piezoelectric vibration device was measured for vibration plate adherence strength according to the same method in Comparative Example 1, retention of high adherence strength was shown by the results of 18 $N/cm^2$ immediately after manufacturing, and 17 $N/cm^2$ after thermo-hygrostat treatment.

[Confirmation of Stability of $LiNbO_3$ Contained at Sintered Compact Surface]

To confirm the stability of $LiNbO_3$ contained at the sintered compact surface of the piezoelectric element pertaining to Example 1, the same method in Comparative Example 1 was used to confirm, with regard to a measurement sample obtained by soaking for 30 minutes in 80° C. warm water a sintered compact on which electrodes were not yet formed, whether or not $LiNbO_3$ was contained at the surface of the sintered compact. As a result, $I_{LN}$ was 2.49 and it was determined that $LiNbO_3$ was contained. The X-ray diffraction measurement result (diffraction line profile) of the measurement sample is shown as (d) in FIG. 1. The diffraction line profile did not show any difference in $LiNbO_3$ peak intensity compared to the diffraction line profile at the sintered compact surface of the piezoelectric element pertaining to Example 1 (refer to (c) in the same figure). Based on this result, it can be argued that $LiNbO_3$ contained at the sintered compact surface of the piezoelectric element pertaining to Example 1 is high in chemical stability and that this contributes to vibration plate adherence strength hardly dropping even after placement in a high-temperature, high-humidity environment.

[Evaluation of Ag Migration from Electrode]

On the piezoelectric vibration device that had been placed in a thermo-hygrostat, AC driving test was performed according to the same method in Comparative Example 1. With regard to the piezoelectric vibration device completing the test, the same method in Comparative Example 1 was used to evaluate the degree of Ag migration from the electrode. Since the region of high Ag concentration in the mapped image did not extend to the piezoelectric ceramic part, it can be argued that, in the piezoelectric vibration device pertaining to Example 1, Ag migration will be inhibited even when the device is placed in a high-temperature, high-humidity environment.

Based on the above, it can be argued that the cause of malfunctioning experienced by a piezoelectric ceramic placed in a high-temperature, high-humidity environment, which has a perovskite compound expressed by the composition formula $Li_xNa_yK_{1-x-y}NbO_3$ (where $0.02<x\leq 0.1$, $0.02<x+y\leq 1$) as its primary component and which contains at least one type of alkali earth metal selected from calcium, strontium, and barium, as well as silver, lies in $Li_3NbO_4$ contained at the sintered compact surface, and that malfunctioning can be prevented by placing the sintered compact in water whose temperature is higher than normal temperature and thereby causing $Li_3NbO_4$ to break down or be removed. It can also be argued that, by heat-treating at 300 to 900° C. in air the sintered compact that has been placed in water whose temperature is higher than normal temperature, any Li compound and Nb compound that may remain at the sintered compact surface after the breakdown of $Li_3NbO_4$ will react with each other to produce $LiNbO_3$ having high chemical stability and electrical insulating property, which in turn will notably limit the occurrence of malfunctioning.

INDUSTRIAL APPLICABILITY

According to the present invention, a piezoelectric element using alkali niobate-based piezoelectric ceramic that resists malfunctioning even when placed in a high-temperature, high-humidity environment, can be provided. This means that the piezoelectric element, as well as various equipment in which it is installed, can be inhibited from malfunctioning even when placed in a high-temperature, high-humidity environment not anticipated under normal use conditions due to carelessness of the user, force majeure, etc., and in this sense the present invention proves useful. Also, in a preferred mode of the present invention, the occurrence of malfunctioning is notably limited while the possibility of short-circuiting and dielectric breakdown can be reduced because the sintered compact surface contains $LiNbO_3$ having excellent chemical stability and electrical insulating property, and in this sense the present invention proves useful.

What is claimed:

1. A piezoelectric element comprising:

a sintered compact formed by a piezoelectric ceramic which has a perovskite compound expressed by a composition formula $Li_xNa_yK_{1-x-y}NbO_3$ (where $0.02<x\leq 0.1$, $0.02<x+y\leq 1$) as a primary component and which contains silver and at least one of alkali earth metal selected from the group consisting of calcium, strontium, and barium, wherein said sintered compact contains $LiNbO_3$ at a surface thereof but contains no $LiNbO_3$ or less $LiNbO_3$ in an inner portion thereof, which is 5 μm or deeper from the surface, than at the surface, wherein a diffraction intensity $I_{LN}$ of $LiNbO_3$ in the inner portion is less than 1.2, wherein $I_{LN}$ is calculated using Formula 1

$$I_{LN} = \frac{I_{1\,max} - I_{1\,min}}{I_{max} - I_{min}} \times 100 \quad \text{(Formula 1)}$$

wherein $I_{max}$ is a maximum value and $I_{min}$ is a minimum value of diffraction intensity over a 2θ range of 10 to 90° of a diffraction line profile using an X-ray diffraction system based on Cu-Kα rays, and $I_{1max}$ is a maximum value and $I_{1min}$ is a minimum value of diffraction intensity in a 2θ range of 23.4 to 24.0° of the diffraction line profile; and at least one pair of electrodes formed on the surface of the sintered compact.

2. The piezoelectric element according to claim 1, wherein a content of the alkali earth metal(s) is 0.2 to 5.0 mol in total relative to 100 mol of the primary component.

3. The piezoelectric element according to claim 1, wherein a content of the silver is 0.5 to 5.0 mol relative to 100 mol of the primary component.

4. The piezoelectric element according to claim 1, wherein the piezoelectric ceramic further contains 0.1 to 3.0 mol of Li and 0.1 to 3.0 mol of Si relative to 100 mol of the primary component.

5. The piezoelectric element according to claim 1, wherein the piezoelectric ceramic further contains 0 to 2.0 mol of Mn relative to 100 mol of the primary component.

6. The piezoelectric element according to claim 1, wherein the at least one pair of electrodes contain silver.

7. A method for manufacturing a piezoelectric element, including:

preparing a sintered compact formed by a ceramic which has a perovskite compound expressed by a composition formula $Li_xNa_yK_{1-x-y}NbO_3$ (where $0.02<x\leq 0.1$, $0.02<x+y\leq 1$) as a primary component and which contains silver and at least one of alkali earth metal selected from the group consisting of calcium, strontium, and barium;

placing the sintered compact in water whose temperature is 60° C. or higher;

forming at least one pair of electrodes on a surface of the sintered compact after removing the sintered compact from the water; and applying voltage between the at least one pair of electrodes, and thereby polarizing the at least one pair of electrodes.

8. The method for manufacturing the piezoelectric element according to claim 7, which further includes heat-treating the sintered compact, upon removal of the sintered compact from the water, at 300 to 900° C. in air, prior to forming of the electrodes.

9. A piezoelectric vibration device including the piezoelectric element according to claim 1, and a vibration plate joined to the piezoelectric element.

* * * * *